United States Patent [19]

Mukawa

[11] 4,184,152
[45] Jan. 15, 1980

[54] CIRCUIT FOR CONVERTING FROM ANALOG SIGNAL INTO DIGITAL SIGNAL AND VICE VERSA BY USING INSULATED GATE FIELD EFFECT TRANSISTORS

[75] Inventor: Tojiro Mukawa, Tokyo, Japan
[73] Assignee: Nippon Electric Co., Ltd., Tokyo, Japan
[21] Appl. No.: 864,450
[22] Filed: Dec. 27, 1977

[30] Foreign Application Priority Data

Dec. 27, 1976 [JP] Japan .................................. 51/156605

[51] Int. Cl.$^2$ ............................................. H03K 13/02
[52] U.S. Cl. ......................... 340/347 C; 340/347 AD; 340/347 DA; 340/347 M
[58] Field of Search ....... 340/347 M, 347 C, 347 AD, 340/347 DA, 347 NT; 357/24; 307/221 R, 221 C, 221 D

[56] References Cited

U.S. PATENT DOCUMENTS

| | | | |
|---|---|---|---|
| 4,051,469 | 9/1977 | Ninomiya ..................... | 340/347 AD |
| 4,065,766 | 12/1977 | Butler et al. .............. | 340/347 NT X |
| 4,070,666 | 1/1978 | Butler et al. .............. | 340/347 NT X |
| 4,070,667 | 1/1978 | Eichelberger ................ | 340/347 NT |
| 4,074,260 | 2/1978 | Butler et al. .............. | 340/347 AD X |
| 4,087,812 | 5/1978 | Terman ..................... | 340/347 DA X |

*Primary Examiner*—Thomas J. Sloyan
*Attorney, Agent, or Firm*—Hopgood, Calimafde, Kalil, Blaustein & Lieberman

[57] ABSTRACT

A signal converting circuit for converting an analog signal to a digital signal, or vice versa, comprises a sampling capacitor which is charged to an input signal level during the period of a sampling pulse. A reference capacitor grounded at one end receives charges from the sampling capacitor in response to a first clock pulse. A predetermined reference potential is impressed on a terminal of the sampling capacitor at the time of the sampling pulse and a ground potential at the time the sampling pulse is not present. The reference capacitor is charged in response to the first clock pulse, and is discharged in response to a second clock pulse which alternates with the first clock pulse. The presence of a potential at the sampling capacitor less than the predetermined reference potential is detected, and the cycles of discharging of the reference capacitor that occur until the potential at the sampling capacitor is less than the reference potential are counted.

Analog-to-digital (A/D) conversion is achieved by counting the number of discharges of the reference capacitor charged from the sampling capacitor. Digital-to-analog (D/A) conversion is carried out in the circuit when the sampling capacitor is charged to the predetermined potential of the sampling capacitor at the time a digital signal is taken out.

9 Claims, 10 Drawing Figures

CIRCUIT FOR CONVERTING FROM ANALOG SIGNAL INTO DIGITAL SIGNAL AND VICE VERSA BY USING INSULATED GATE FIELD EFFECT TRANSISTORS

This invention relates generally to a circuit for converting signals, and more particularly to a circuit for converting an analog signal into a digital signal and vice versa.

One known application of a signal converting circuit is a digital filter which converts an analog signal into a digital signal (herinafter referred to as A/D conversion), and then converts the digital signal thus converted back into the analog signal (hereinafter referred to as D/A conversion). The digital filter including an A/D convertor and a D/A convertor may provide a highly accurate filtering characteristic, as compared with an analog filter. However, the A/D convertor and D/A convertor are complicated in construction and high in cost, so that digital filters have thus far found only very limited application.

Several different kinds of convertors have been recently proposed for converting an analog signal into a digital signal which incorporate the progress that has been made in technology. However, because of the difficulty in providing an A/D convertor and a D/A convertor which have the same accuracy, a convertor that is well adapted for use as a digital filter has not yet been achieved.

An A/D convertor has been proposed, in which a signal sampled according to a first clock pulse is charged into a sampling capacitor, one end of which is grounded. The drain of a first insulated gate field effect transistor is connected to the other end of the capacitor, and charges in a reference capacitor connected between the gate and source of this transistor are in turn charged into the sampling capacitor with a second clock pulse. The timing, when a potential at the other end of the sampling capacitor reaches a threshold potential of the field effect transistor, is detected; whereby the number of second clock pulses generated up to this time are taken out as a digital signal corresponding to the input analog signal.

In this A/D converter charging the reference capacitor requires the complicated steps of charging a sub-reference capacitor in response to the second clock pulse, and then charging a reference capacitor via the drain of a second insulated gate field effect transistor, whose gate and source are connected to the opposite ends of the sub-reference capacitor by a third clock pulse whose phase does not overlap that of the second clock pulse. For the transfer of charges from the sub-reference capacitor to the reference capacitor or from the reference capacitor to the sampling capacitor, if the trailing edges of the second and third clock pulses are steep, the result is poor transfer efficiency, since the transfer of the charge is dependent only on the occurrence of a conductive channel due to the clock pulse applied to the gate electrode but not on the potential difference. Accordingly, the trailing edges of the second and third clock pulses have to be inclined to some extent, which results in a lowered operating speed for this A/D convertor.

It is an object of the present invention to provide a signal converting circuit which is well adapted for use in a digital filter and achieves the signal conversion at relatively high reproducibility.

It is another object of the present invention to provide a signal converting circuit which includes insulated gate field effect transistors (referred to hereinafter as IGFETs) and capacitors as elements, and which is simple in construction and high in operating speed.

According to the present invention, there is provided a signal converting circuit comprising a sampling capacitor having first and second terminals and adapted to be charged to an input signal level during the application of sampling pulse, a reference capacitor having first is second terminals and adapted to receive charges from the sampling capacitor in response to a first clock pulse, the first terminal of the reference capacitor being grounded. Means are connected to the second terminal of the sampling capacitor for impressing on the second terminal of the sampling capacitor a predetermined reference potential at the time the sampling pulse appears and a ground potential at the time the sampling pulse; disappears. The reference capacitor is charged from the sampling capacitor in response to the application of the first clock pulse and is discharged in response to a second clock pulse, which is present between the occurrence of the first clock pulses. Means are provided to detect when the potential at the first terminal of the sampling capacitor is smaller than the predetermined reference potential, and to count the cycles of discharging of the reference capacitor until the potential of the first terminal of the sampling capacitor becomes smaller than the predetermined reference potential.

In the converting circuit of the present invention, a signal is converted by transferring charges from the sampling capacitor to the reference capacitor, while discharging charges accumulated in the reference capacitor sequentially.

A/D conversion is enabled by counting the number of dischargings of the reference capacitor charged from the sampling capacitor. D/A conversion is enabled when the sampling capacitor is charged to the predetermined potential of the sampling capacitor at the time a given digital signal is taken out. In D/A conversion, although an analog signal is inverted in phase, this may be corrected by an inverter. Thus, the A/D and D/A conversions may be enabled according to the same arrangement, so that the desired reproduction of an analog signal may be achieved, even if the D/A conversion is effected after the A/D conversion, as in a digital filter.

The fabrication of the signal converting circuit of the invention is relatively simple as compared to prior art converting circuits. Moreover, since the transfer of charges from the sampling capacitor to the reference capacitor is effected with a potential difference, clock pulses having steep leading and trailing edges may be employed, such that speedy operation is achieved by this circuit.

The above and further objects, features and advantages of the present invention will become more apparent from the following detailed description taken in conjunction with the accompanying drawings, wherein.

Figure 6A:
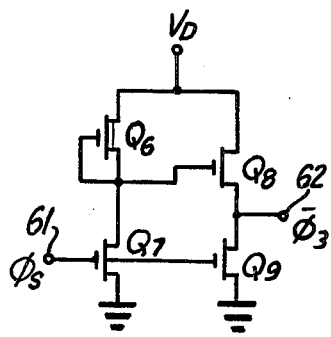
Figure 6B:
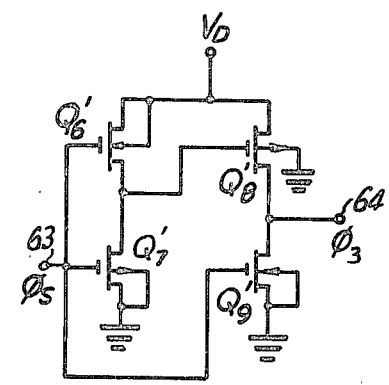
Figure 7:
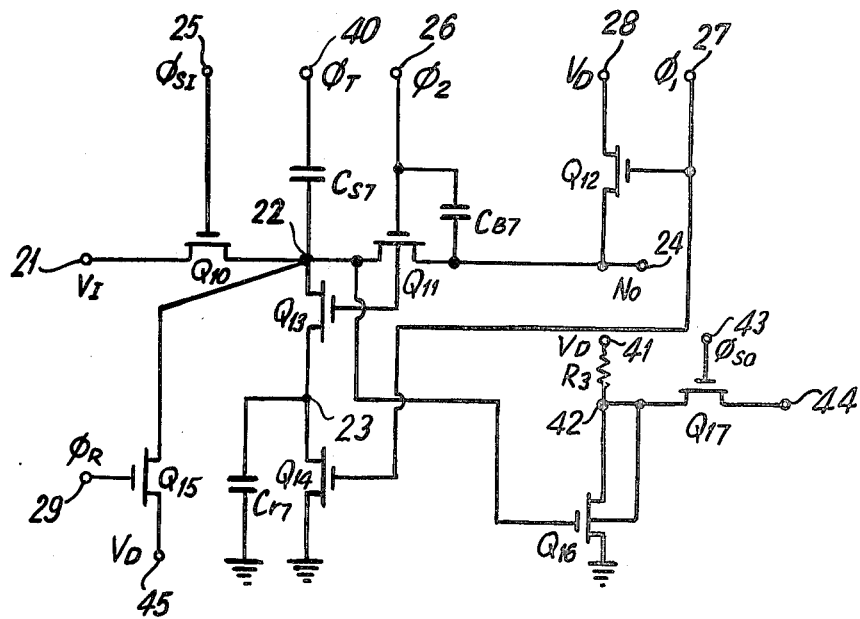
Figure 8:
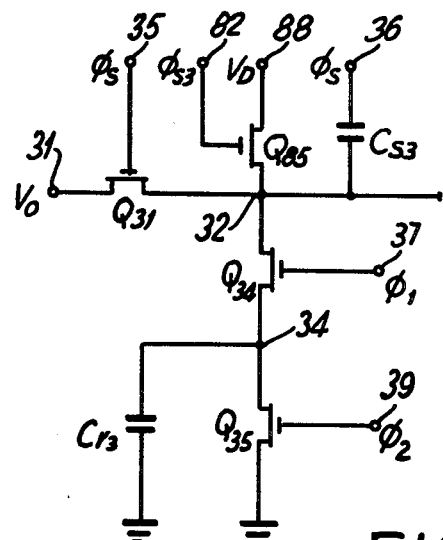
Figure 9:
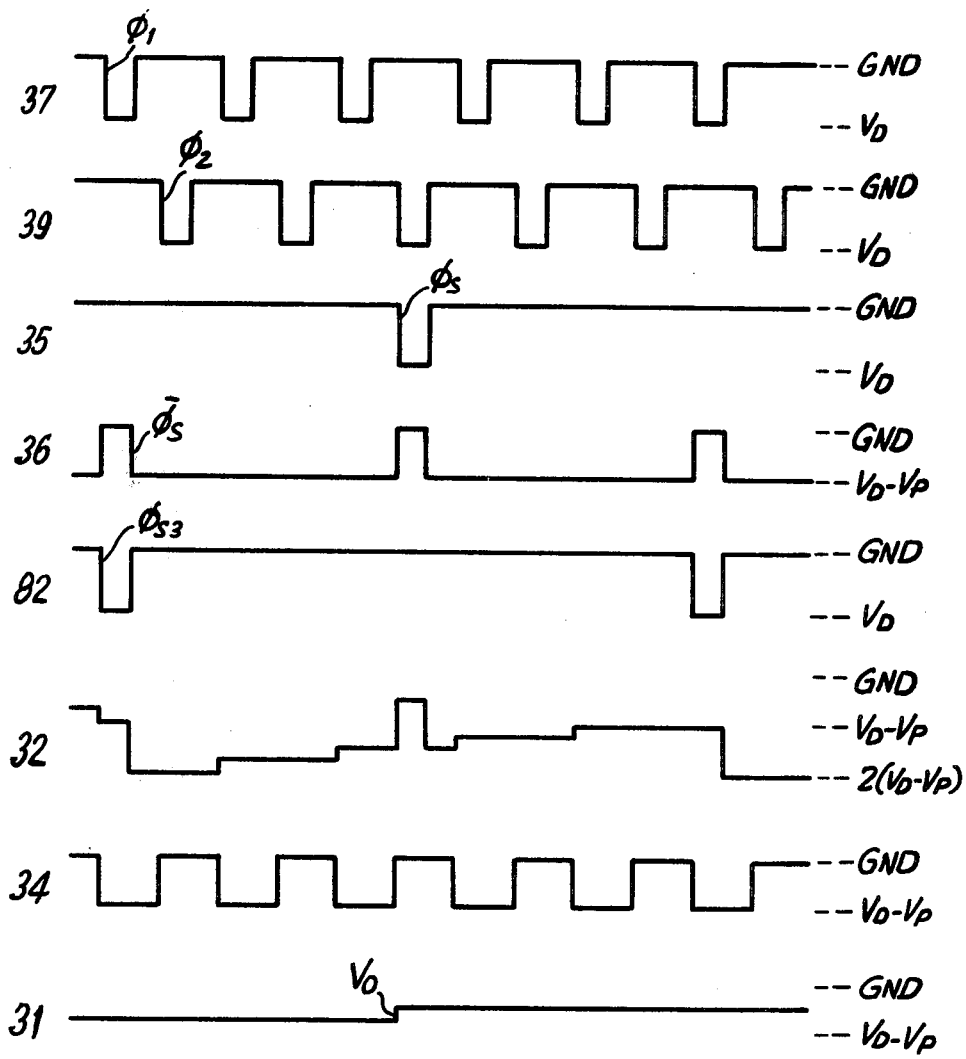

FIGS. 6(a) and 6(b) are circuit diagrams for obtaining sampling signals $\phi_s$ and $\overline{\phi_s}$;

FIG. 7 is a circuit diagram of a signal converting circuit according to a second embodiment according to the invention;

FIG. 8 is a circuit diagram of a signal converting circuit according to a third embodiment of to the invention; and FIG. 9 is a diagram showing timing and wave form at respective portions of the circuit shown in FIG. 8.

Figure 1:
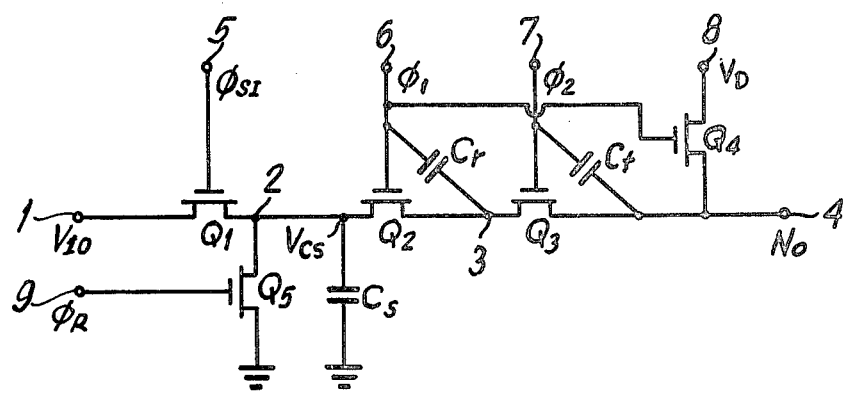
FIG. 1 is a diagram of a prior art signal converting circuit.

Unless otherwise specified, the prior art circuit and the several embodiments of the invention are described for purposes of description as including P-channel enhancement type MOSFETs as the transistors used. It should, however, be noted that N-channel enhancement type MOSFETs may be used in place of the P-channel enhancement type MOSFETs in these circuits. Referring to FIG. 1, the prior art signal converting circuit therein shown includes a sampling capacitor Cs, a reference capacitor Cr, and a temporarily charge storing capacitor Ct for supplying charges to the reference capacitor Cr. The signal conversion is effected by transferring the charges from the reference capacitor Cr to the sampling capacitor Cs. In more detail, A/D conversion is effected by counting the number of sequential transferences of the charges in the sampling capacitor Cs to the reference capacitor Cr until the potential across the sampling capacitor Cs equals to the predetermined value of the potential sampled from the input signal. D/A conversion is also effected by detecting the potential across the sampling capacitor Cs after charging the predetermined times from the reference capacitor Cr. The prior art signal converting circuit additionally includes a sampling transistor Q1, transferring transistors Q2 and Q3, a transistor Q4 for use in charging the temporarily charge storing capacitor Ct, and a resetting transistor Q5. The transistors Q1 to Q5 preferably all have the same pinch-off voltage. The switching transistor Q1 has its source connected to a terminal 1, its drain connected to a junction 2 to the sampling capacitor Cs, and its gate connected to a terminal 5 for receiving a timing signal $\phi_{s1}$. The terminal 1 is used as an input terminal when the circuit is used for A/D conversion and as an output terminal when the circuit is used for D/A conversion. The transistor Q2 has its source connected to the junction 2, its drain connected to a junction 3 and to the source of the transistor Q3, and its gate connected to a terminal 6 for receiving a first clock signal $\phi_1$, respectively. A reference capacitor Cr is provided between the junction 3 and the terminal 6. The transistor Q3 has its drain connected to an output terminal 4, and its gate connected to a terminal 7 for receiving a second clock signal $\phi_2$, and the capacitor Ct whose capacitance is larger than that of the reference capacitor Cr, is provided between the drain and the gate of the transistor Q3. The output terminal 4 is used for deriving a digital signal No when the circuit operates as A/D converter, but has no effect during D/A conversion. The transistor Q4 has its source connected to the output terminal 4, its gate connected to the terminal 6, and its drain connected to a power supplying terminal 8, to which is supplied a voltage $V_D$ whose level is equal to the low levels of the first and second clock signals $\phi_1$, $\phi_2$. In addition, a resetting transistor Q5 has its gate connected to a terminal 9 for receiving a resetting signal $\phi_R$, its drain connected to the junction 2, and its source is grounded. The sampling capacitor Cs is connected between the junction 2 and ground, and has a capacitance larger than that of the reference capacitor Cr.

Figure 2:
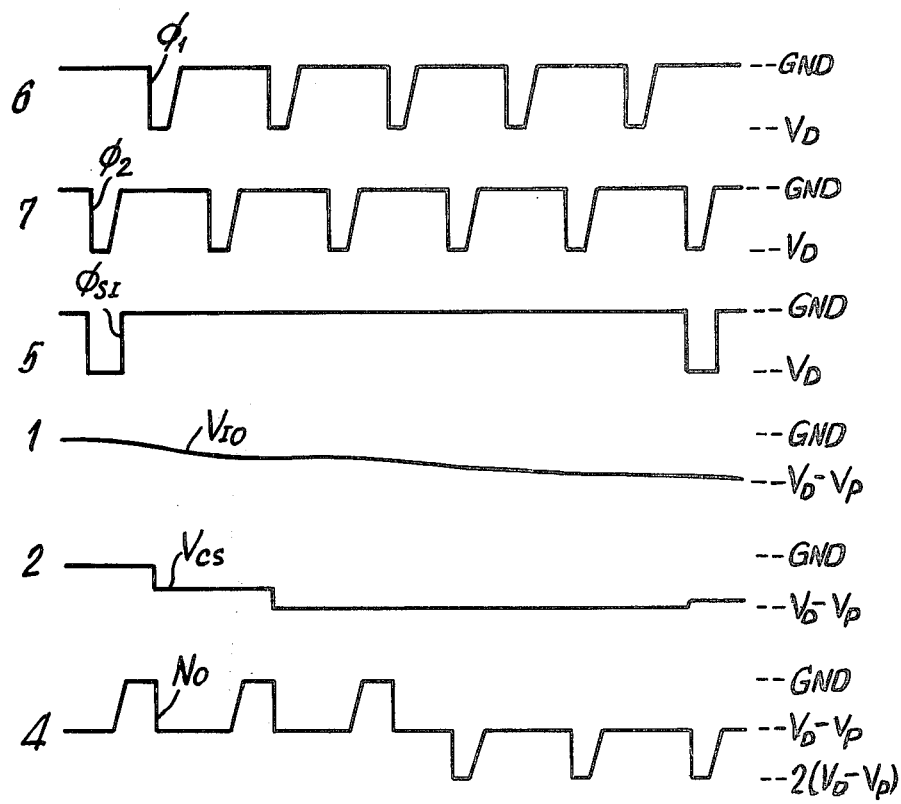
FIG. 2 is a diagram representing timing and wave forms at respective portions of the circuit in FIG. 1.

The operation of the prior art circuit of FIG. 1 is now described with reference to the wave forms shown in FIG. 2. First, in A/D conversion, when the timing signal $\phi_{s1}$, the first and second clock signals $\phi_1$ and $\phi_2$, and resetting signal $\phi_R$ are absent, then the junctions 2 and 3 and output terminal 4 are maintained at $V_D - V_P$ level i.e., the source voltage $V_D$ less the pinch-off voltage $V_P$. When an input analog signal $V_{10}$ is applied from the input terminal under this above condition, and the timing signal $\phi_{s1}$ having a level of the source voltage $V_D$ is applied to the terminal 5, then the transistor Q1 becomes conductive, and hence the input signal $V_{10}$ is read by being charged into the sampling capacitor Cs. When the transistor Q1 becomes non-conductive, then first and second clock signals $\phi_1$, $\phi_2$ which are not overlapping are brought to a low level, alternately, so that given charges are transferred from the reference capacitor Cr into the sampling capacitor Cs by way of the transistor Q2, once per cycle. The charging is repeated until the potential at the junction 2 becomes higher than $V_D - V_P$, at which time the charging from the capacitor Cr is stopped, so that the excess in potential thereof appears at the output terminal 4 in the form of an inversion in voltage of the output pulse No as seen in the waveform 4 of FIG. 2. At this time, the output pulse $N_O$ inverts its phase with respect to the voltage level $V_D - V_P$. In case the output pulse $N_O$ is applied to a circuit having a threshold value between ground potential and $V_D - V_P$, then the output pulse $N_O$ having an amplitude of ground potential to $V_D - V_P$ may be detected as an output, whereas if the output pulse $N_O$ is applied to a circuit having a threshold value between $V_D - V_P$ and $2(V_D - V_P)$, the output pulses $N_O$ having an amplitude of $V_D - V_P$ to $2(V_D - V_P)$ may be detected as output. This output may be considered to be a series of digital signals corresponding to the analog signal at the time of sampling.

The A/D conversion characteristic of the signal conversion circuit shown in FIG. 1 is given as:

$$N_0 = \frac{C_s}{C_2} \cdot \frac{V_D - V_P - V_1}{V_D - V_P + V_T} \qquad (1)$$

In the prior art circuit of FIG. 1, when a pulse representing at the same time as the occurrence of the last pulse of the digital signal, which was obtained as the result of the A/D conversion is supplied to the terminal 5, an analog signal is obtained at the terminal 1 as an output signal. The D/A conversion characteristic at this time may be approximated as:

$$V_O = C_2/C_s (V_D - V_P + V_T) N_1 \ldots \qquad (2)$$

In the equations (1) and (2), $V_T$ represents the threshold voltage of the MOSFET: $V_P$ represents the pinch-off voltage of the MOSFET, $V_1$ is an input signal voltage at the terminal 1, $N_O$ is the number of output pulses at the terminal 4, $N_1$ is the timing number corresponding to the digital signal to be impressed on the terminal 5, and $V_O$ is an output analog signal voltage to be supplied to the terminal 1.

To charge the reference capacitor Cr from the voltage source connected to the terminal 8, the prior art circuit requires the use of transistors $Q_4$ and $Q_3$, and the capacitor $C_t$, thus resulting in a circuit which has a complicated arrangement. In other words, since the charges at this time are transferred by the first and second clock pulses $\phi_1$, $\phi_2$, the trailing edges of these clock pulses should be inclined for high transfer efficiency so that the processing speed of the prior art circuit is lowered.

Figure 3:
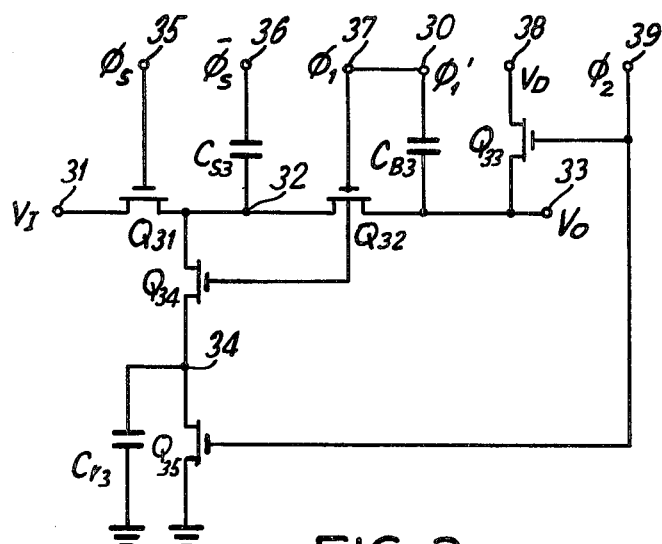
FIG. 3 is a circuit diagram of a signal converting circuit according to a first embodiment of the invention.

With respect to the one embodiment of the the present invention illustrated in FIG. 3, a description is first given of the A/D conversion circuit. As shown in FIG. 3, the circuit includes a first terminal or first node 31 and a second terminal or second node 33. When the circuit is used as an A/D converter, the terminal 31 is used as an input terminal for receiving an analog signal, whereas the terminal 33 is used as an output terminal for deriving a digital signal. The circuit further comprises a sampling transistor $Q_{31}$ for sampling the input analog signals, a sampling capacitor $Cs_3$ for holding the signal thus sampled, a reference capacitor $Cr_3$, one end of which is grounded and which is adapted to discharge the sampling capacitor $Cs_3$, transistor $Q_{32}$ for detecting the potential at the junction 32, a transistor $Q_{33}$ for charging the additive capacitor $C_{B3}$, a transistor $Q_{34}$ for charging reference the capacitor $Cr_3$ in response to the first clock pulse $\phi_1$, and a transistor $Q_{35}$ for discharging the capacitor $Cr_3$. The five transistors $Q_{31}$ to $Q_{35}$ should have the same pinch-off voltage $V_P$. The source of transistor $Q_{31}$ is connected to the terminal 31, its drain is connected to the source of the transistor $Q_{32}$ as well as to the junction 32 leading to the sampling capacitor $Cs_3$, and its gate is connected to a terminal 35 which receives the sampling pulse $\phi_s$. The gates of the transistors $Q_{32}$ and $Q_{34}$ are connected to a terminal 37 for receiving the first clock pulse $\phi_1$, and the drain of the transistor $Q_{32}$ is connected to the source of the transistor $Q_{33}$ as well as to the terminal 33. The transistor $Q_{34}$ has its source connected to one end of the reference capacitor $Cr_3$ and its drain connected to the junction 32. The transistor $Q_{35}$ has its source connected to a junction 34 and its drain is grounded. The additive capacitor $C_{B3}$ is connected between the terminal 33 and a terminal 30 for enhancing the sensitivity of the output detection. The terminal 30 is connected to the input terminal 37 to which the first clock pulse $\phi_1$ is applied. In addition, the gates of transistors $Q_{33}$ and $Q_{35}$ are connected to the terminal 39 for receiving the second clock pulse $\phi_2$, and the source of the transistor $Q_{33}$ is connected to the terminal 38 to which is voltage $V_D$. The pulses $\phi_s$, $\phi_1$ and $\phi_2$ may, as is here assumed, have the same amplitude which is equal to the source voltage $V_D$.

The relationship between the signals to be supplied to respective terminals of the circuit of FIG. 3 is now described. First, the first clock pulse $\phi_1$ supplied from the terminal 37 to the gates of transistors $Q_{32}$ and $Q_{34}$ is equal in frequency to the second clock pulse $\phi_2$ supplied from the terminal 39 to the gates of transistors $Q_{33}$ and $Q_{35}$, although the former is different in phase from the latter and there is no overlap between these pulses. In addition, the first clock pulse $\phi_1$ is supplied after the sampling pulse $\phi_s$, or preferably with some time lag, from the sampling pulse $\phi_s$. Since this embodiment is described as using P-channel enhancement type MOSFETs, the source voltage is of a negative.

Figure 4:
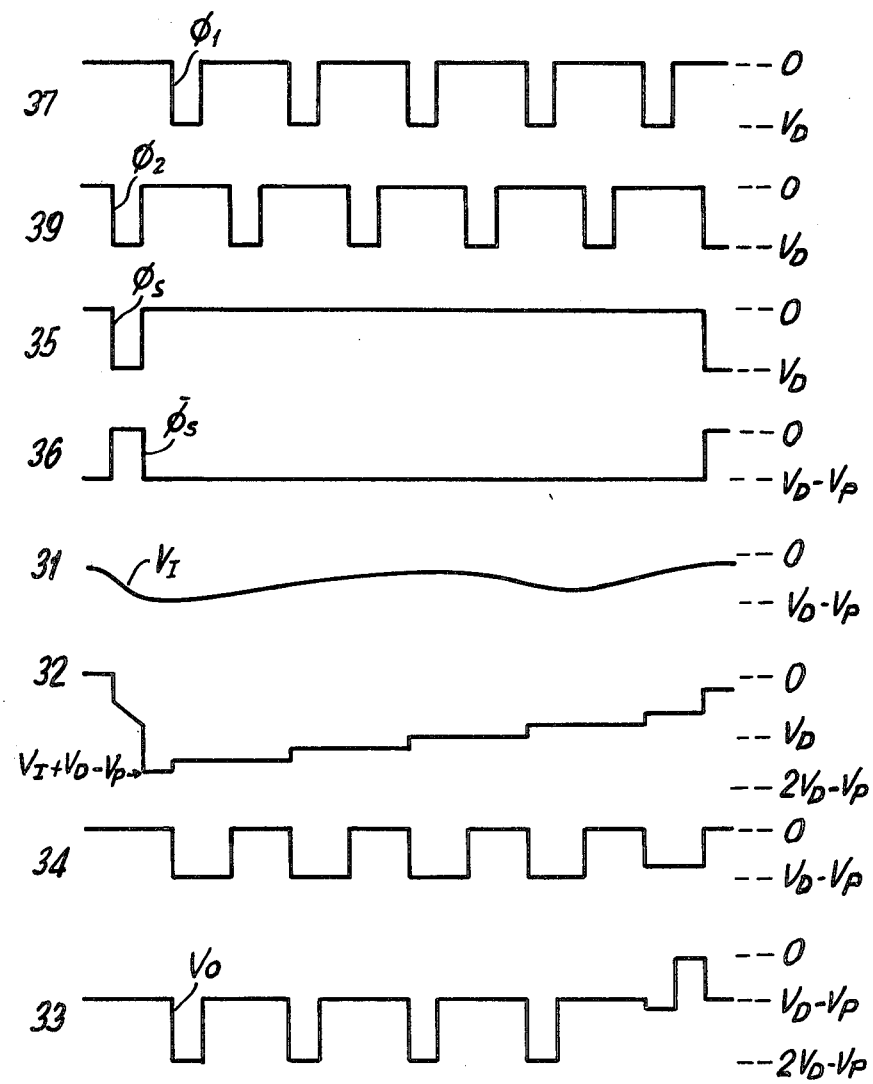
FIG. 4 is a diagram representing timing and wave form at respective portions of the embodiment of the invention shown in FIG. 3.

The pulse $\overline{\phi}_s$ applied to terminal 36 has a phase inverse to that of the sampling pulse $\phi_s$. One end of the sampling capacitor $Cs_3$ is connected to terminal 36. This pulse $\overline{\phi}_s$ (as shown in FIG. 4) has an amplitude that varies from ground potential to the potential $(V_D-V_P)$ wherein $V_D$ represents the source voltage, and $V_P$ represents the pinch-off voltage of the transistors. For the convenience of description, it is assumed that the value of capacitance of capacitors $Cs_3$, $Cr_3$, and $Cb_3$ are selected such that $Cs_3 > Cr_3 > CB_3$. However, these capacitors need only meet the relationship of $Cs_3 \geqq Cr_3 \geqq CB_3$ for operation of the circuit.

A description of the operation of the circuit of in FIG. 3 is now provided with reference to the wave forms of FIG. 4. When the sampling pulse $\phi_s$ is applied to the terminal 35 in synchronism with the second clock pulse $\phi_2$ supplied to the terminal 39, and the pulse $\overline{\phi}_s$ at ground potential is applied to the terminal 36, the transistor $Q_{31}$ becomes conductive and the input signal $V_1$ applied to the input terminal 31 is read into the sampling capacitor $Cs_3$. At this time, the transistor $Q_{35}$ is made conductive by the second clock pulse $\phi_2$ applied to its gate, thereby causing the reference capacitor $Cr_3$ to discharge to ground through the source-drain path of that transistor. Then the sampling pulse $\phi_s$ is no longer in synchronism with the second clock pulse $\phi_2$, then the transistor $Q_{31}$ becomes nonconductive, and the input voltage level $V_I$ at the time of sampling is held in the sampling capacitor $Cs_3$. At this time, the potential of the terminal 36 connected to the sampling capacitor $Cs_3$ becomes $V_D-V_P$, so that the potential at the junction 32 is lowered to $V_I+V_D-V_P$.

Subsequently, when the voltage at the terminal 37 is brought to a low level $(V_D)$ by the first clock pulse $\phi_1$, the transistor $Q_{34}$ becomes conductive, and the potential at the junction 34 is lowered to the potential $(V_D-V_P)$ by charging the capacitor $Cr_3$. The capacitor $Cr_3$ is selected to be smaller in capacitance than the capacitor $Cs_3$, so that the potential at the junction 34 is rapidly shifted, as compared with the potential at the junction 32. On the other hand, the other transistor $Q_{32}$ remains nonconductive irrespective of the phase of the first clock pulse $\phi_1$, when the potential at the junction 32 is lower than $V_D-V_p$ by charges sampled in the capacitor $Cs_3$, so that the first clock pulse $\phi_1$ is supplied to the capacitor $CB_3$ and the potential at the output terminal 33 becomes $2V_D-V_P$. When the first clock pulse $\phi_1$ disappears, and second clock pulse $\phi_2$ is applied to the terminal 39 again, the transistor $Q_{35}$ becomes conductive causing capacitor $Cr_3$ to discharge and the junction 34 is brought to ground potential.

It is assumed that one cycle covers the period which the first and second clock pulses $\phi_1$, $\phi_2$ are applied. When the potential at the junction 32 becomes higher than $V_D-V_P$ after a number of N applications of the first clock pulse $\phi_1$ and the transistor $Q_{32}$ becomes conductive, the charges stored in the capacitor $CB_3$ are shifted to the sampling capacitor $Cs_3$. Then, when the first clock pulse $\phi_1$ disappears, the potential at the output terminal 33 becomes higher than $V_D-V_P$, so that the termination of discharging of the capacitor $Cs_3$ to an input signal level may be detected. The capacitor $CB_3$ is selected to provide a capacitance smaller than that of the sampling capacitor $Cs_3$, so that a variation in potential across the sampling capacitor corresponding its discharge charges is large, with the result that the potential variation at the junction 32 appears at the output terminal 33 in an amplified form. As a result, an increase in potential at the junction 32 higher than $V_D-V_P$ may be readily detected.

The charges needed to bring the potential at tne junction 32 connected to the sampling capacit $Cs_3$ from $V_1+V_D-V_p$ to the $V_D-V_p$ are equal to charges of the sampling capacitor charged a total of N times. Accordingly, the A/D conversion characteristic is given by:

$$Cs\{(V_1+V_D-V_p)-(V_D-V_p)\}=N\cdot C(V_D-V_p) \quad (5)$$

Form this equation, the charging cycle N is given as below:

$$N=Cs/C\cdot V_1/V_D-V_p\ldots \quad (3)$$

If it is assumed that the source of the transistor $Q_{35}$ is connected to a bias voltage $V_c$ higher than $V_D$, not to ground. Then, $Cs\{(V_1+V_D-V_p)-(V_D-V_p)\}=N\cdot C(V_D-V_p-V_c)$
From this equation, $$N=Cs/C\cdot V_1/V_D-V_p-A\ Vc\ldots \quad (4)$$

As is clear from the equation (4), the A/D conversion characteristic of the circuit of FIG. 3 may be adjusted according to a bias voltage $V_c$.

Figure 5:
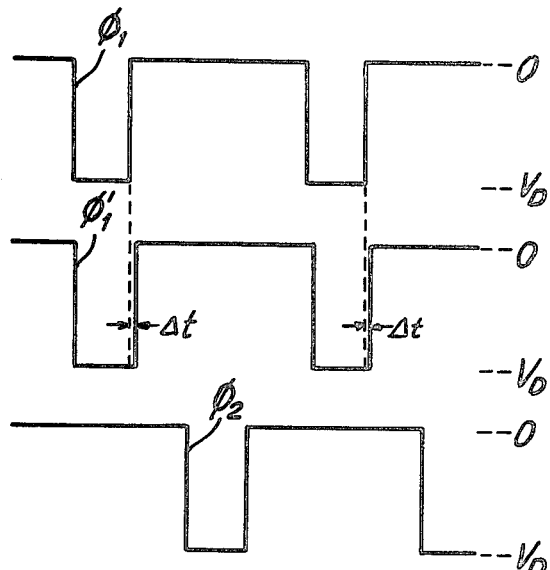
FIG. 5 is a diagram showing wave forms of the clock pulses applied to the circuit of FIG. 3 for accelerating the A/D conversion speed.

In the embodiment of FIG. 3, the terminal 30 is connected to the terminal 37. However, a clock pulse $\phi_1'$ which is somewhat delayed from the first clock pulse $\phi_1$, as shown in FIG. 5, may be supplied to the terminal 30 in a manner that the clock pulse $\phi_1'$ does not overlap the second clock pulse $\phi_2$, thereby quickly stabilizing a varying output level at the output terminal 33, which is caused by the discharge of the capacitor $CB_3'$ enabling the high-speed A/D conversion. The output signal Vo from the output terminal 33 is delivered to an external counter (not shown in FIG. 3), so that a digital signal corresponding to the level of the analog input signal may be supplied to an A/D conversion circuit.

FIGS. 6(a) and 6(b) schematically illustrate circuits for forming the pulse $\overline{\phi}_s$ from the pulse $\phi_s$ to be supplied to the terminal 35 of the circuit of FIG. 3. FIG. 6(a) illustrates a circuit using a single depletion type MOSFET $Q_6$ and three enhancement type MOSFETs $Q_7$ $Q_8$, and $Q_9$, while FIG. 6(b) shows a circuit of FIG. 6(a) using the complementary circuit of N-channel FETs $Q_7'$ and $Q_9'$ and P-channel FETs $Q_6'$ and $Q_8'$. In either case, when the signal applied to the terminal 61 (or 63) is brought to a low level, then a ground potential is delivered from the terminal 62 and (or 64). On the other hand, when the signal at the terminal 61 (or 63) is brought to ground potential, then a voltage $V_D-V_p$ is delivered from the terminal 62 and (or 64). Thus, the pulse $\overline{\phi}_s$ having an amplitude of $V_D-V_p$ is obtained at the terminal 62 (or 64) from the pulse $\phi_s$ applied to the terminal 61 or 63. The A/D conversion circuit of FIG. 3 may be used as a D/A conversion circuit by using additional circuits.

The conversion circuit according to a the second embodiment of present invention, as illustrated in FIG. 7, includes a transistor $Q_{10}$ for use in switching, upon A/D conversion; a transistor $Q_{15}$ for use in D/A conversion; a transistor $Q_{13}$ for transferring a given amount of charges; a transistor $Q_{14}$ for discharging the charges from the capacitor $Cr_7$; a transistor $Q_{11}$ adapted to detect when the potential at a junction 22 to the capacitor $Cs_7$ becomes higher than $V_D-V_p$; and a transistor $Q_{12}$ for supplying charges to the output detecting capacitor $CB_7$. In addition, transistors $Q_{16}$ and $Q_{17}$ are provided for delivering an analog signal in the form of a corrected potential from the junction 22. Transistors $Q_{10}$ to $Q_{15}$ and $Q_{17}$ preferably have the same pinch-off voltage $V_p$, whereas the transistor $Q_{16}$ has a threshold voltage $V_T$.

The drain of transistor $Q_{10}$ is connected to an input terminal 21 for an analog signal $V_I$, its gate is connected to a terminal 25 for the sampling pulse $\phi_{s1}$, and its source is connected to the junction 22 leading to the capacitor $Cs_7$. Also connected to the junction 22 are the sources of the transistors $Q_{15}$, $Q_{11}$ and the drain of the transistor $Q_{13}$. Connected to the junction 23 and to the capacitor $Cr_7$ are the source of the transistor $Q_{13}$ and the drain of the transistor $Q_{14}$. The source of the transistor $Q_{14}$, together with the other end of the capacitor $Cr_7$, are grounded. The transistor $Q_{11}$ has its drain connected to an output terminal 24 as well as to the source of the transistor $Q_{12}$, and its gate is connected to a terminal 26 for a clock pulse $\phi_2$. The gates of the transistors $Q_{12}$ and $Q_{14}$ are connected to a terminal 27, to which is supplied a clock pulse $\phi_1$, while the gate of the transistor $Q_{13}$ is connected to an input terminal 26 for the clock pulse $\phi_2$. The drains of transistors $Q_{12}$ and $Q_{15}$ are respectively connected to input terminals 28 and 45 for the source voltage $V_D$, and the gate of the transistor $Q_{15}$ is connected to an input terminal 29 for a resetting pulse $\phi_r$. As noted, one end of capacitor $Cs_7$ is connected to the junction 22, and its other end is connected to a terminal 40, to which is supplied a control signal $\phi_T$. The transistor $Q_{16}$, which forms an output-side circuit for the D/A conversion has a gate connected to the junction 22, and a source connected to a junction 42, and its drain is grounded. A resistor $R_3$ is connected between the junction 42 and a terminal 41 for the source voltage $V_D$, and the drain of the transistor $Q_{17}$ is connected to the junction 42. The transistor $Q_{17}$ has its source connected to an output terminal 44 for deriving an analog output signal, and its gate is connected to a terminal 43 for a timing signal $\phi_{s0}$, which is supplied upon the D/A conversion. The circuit arrangement for transistors $Q_{10}$ to $Q_{14}$ is identical to that of transistors $Q_{31}$ to $Q_{35}$ in the circuit shown in FIG. 3. In the operation of the circuit of FIG. 7 in A/D conversion, the capacitor $Cs_7$, junction 22, junction 23 to the capacitor $Cr_7$, and output terminal 24 are maintained at a voltage $(V_D-V_p)$ obtained by subtracting the pinch-off voltage $V_p$ at the transistors $Q_{11}$ to $Q_{14}$ from the voltage source $V_D$. The terminals 25, 26, 27, 28, 29, 40, 43 are grounded, and terminals 28, 41, 45 are connected to the voltage source $V_D$. Under this condition, when the sampling pulse $\phi_{s1}$ is supplied and the terminal 25 is brought to a low level, the transistor $Q_{10}$ becomes conductive, and the input signal voltage $V_1$ impressed on the input terminal 21 is read at the junction 22 and is held by the capacitor $Cs_7$. When the terminal 25 is brought back to a high level, an input signal voltage $V_1$ is maintained at an inter-terminal voltage for the capacitor $Cs_7$. When the level of control pulse $\phi_T$ to be supplied to the terminal 40 is brought to $V_D-V_p$, the potential at the junction 22 is lowered by the capacitor $Cs_7$ to $V_D-V_p+V_1$.

A clock pulse $\phi_2$ to be supplied to the terminal 26, of the clock pulse $\phi_2$ which is in an inverted phase relation to the clock pulse $\phi_1$ and does not overlap with the pulse $\phi_1$, is brought to a low level. Transistor $Q_{13}$ then becomes conductive, and a given amount of charges which is a product of the capacitance of the capacitor $Cr_7$ and the voltage $(V_D-V_p)$ is delivered from the capacitor $Cs_7$ to the capacitor $Cr_7$. When the clock pulse $\phi_1$ to be supplied to the terminal 27 is brought to a low level, the transistor $Q_{14}$ is rendered conductive, thereby discharging the capacitor Cr7 to ground potential. During the time that the potential at the junction 22 remains lower than $V_D-V_p$, the aforesaid operation is repeated for the transfer of charges. Meanwhile, the transistor Q11 is not conductive, because when the potential at the junction 22 is lower than $V_D-V_p$, even if the clock pulse $\phi_2$ reaches a low level, the potential at the output terminal 24 becomes $2(V_D-V_p)$.

When the potential at the junction 22 becomes higher than $V_D-V_P$, and the clock pulse $\phi_2$ is brought to a low level ($V_D$), then the transistor Q11 becomes conductive and the charges stored in the capacitor CB7 are shifted into the capacitor Cs7 and Cr7. Thus, when the clock pulse $\phi_2$ is brought to the high level (ground potential), a potential at the output terminal 24 is raised by the capacitor CB7, and is delivered from the output terminal 24 as an output pulse. The count number N0 is proportional to the input signal voltage V1 at the sampling time, wherein N0 is a count number from the time when the control signal $\phi_T$ becomes $V_D-V_T$ in an external circuit, until an output signal is received from the output terminal 24. Accordingly, the signal conversion characteristic of this circuit is given as:

$$N_0 = Cs/C_2 \cdot V_1/V_D - V_P \qquad (5)$$

When this circuit is used as a D/A conversion circuit, the circuit is so arranged that a timing pulse $\phi_{s0}$ is supplied from the terminal to the gate of the transistor Q17, when the cycle at which the clock pulse $\phi_2$ is brought to a low level becomes equal to the pulse number obtained by the A/D conversion circuit. When a resetting signal $\phi_R$ is supplied to bring the terminal 29 to a low level, with the terminal 20 for the control signal $\phi_T$ being maintained at ground potential, the transistor Q15 becomes conductive, and the potential at the junction 22 becomes $V_D-V_P$. Then, when the control signal $\phi_T$ is supplied to bring the terminal 40 to a potential $V_D-V_P$, the potential at the junction 22 is lowered by the capacitor Cs7 to $2(V_D-V_P)$. Subsequently, when the clock pulses $\phi_1$ and $\phi_2$ are brought to a low level and a high level, alternately, the charges in the capacitor Cs7 are transferred at a given rate to the capacitor Cr7 via transistor Q13, and are discharged due to the transistor Q14 being conductive. This operation is repeated a number of times of an input signal number N1, after which the potential of the control signal $\phi_T$ for the terminal 40 is lowered to a potential which is lower than the ground potential by a threshold voltage for the transistor Q16, and the timing signal $\phi_{s0}$ is applied to the terminal 43 to lower the potential at the terminal 43. Then, an output voltage V0 associated with the input signal number N1 appears at the output terminal 44. In the embodiment of FIG. 7, when the control pulse $\phi_T$ to be supplied to the terminal 40 is brought to a potential which is lower than a threshold voltage by the ground potential, $V_D-V_P$, and a threshold voltage $V_T$ for the transistor Q16, an input for a source follower may be provided. The arrangement of the circuit for supplying a control pulse $\phi_T$ having three levels to the terminal 40 is such that a ground potential and potential $V_D-V_P$ are determined in synchronism with the low level ($V_D$) of the timing pulse $\phi_{s0}$ and ground potential, whereas a threshold voltage and a ground potential of the transistor Q16 are determined in synchronism with the low level ($V_D$) of the timing pulse $\phi_{s0}$ and ground potential. The aforesaid circuit may be provided in a combination of an inverter circuit having the same pinch-off voltage as that of a P-channel MOSFET forming a signal conversion circuit, with a circuit interconnecting the drain and gate of the N-channel MOSFET having the same threshold voltage $V_T$ as that of the transistor Q16 and adapted to turn on and off the circuit whose source is grounded, commensurate to the timing pulse $\phi_{s0}$.

The D/A conversion characteristic of the circuit is given as below:

$$V_0 = (V_D - V_P)(1 - (C_2/Cs) N_1) \qquad (6)$$

When an input obtained by subtracting an output pulse number N0 obtained by A/D conversion from the maximum pulse number Cs7/Cr7 obtained when $V_D-V_P$ is fed into the A/D conversion circuit is fed into the D/A conversion circuit as an input, the output obtained is the voltage V0, which is substantially equal to the input voltage V1.

When an output signal for the digital filter is inverse in phase to the input signal, the pulse number obtained by the equation (3) may be directly fed into the circuit. If an output is required to be taken out from a source follower circuit of MOSFET, a pulse number corresponding to a threshold voltage of MOSFET may be compressed for and fed into the circuit as an input.

When the circuit shown in FIG. 7 is used as a D/A conversion circuit, unless the junction has been precharged to $V_D-V_P$, the D/A conversion cannot be effected, so that it is difficult to continuously take out outputs.

FIG. 8 shows the third embodiment of the invention, in which there is provided a D/A conversion circuit that permits the out outputs to be taken out continuously. FIG. 9 shows the operational wave forms in respective portions of the circuit shown in FIG. 8, which comprises a MOSFET Q85 for charging the sampling capacitor Cs3. The other arrangements of the circuit of FIG. 8 are similar to those of the circuit of FIG. 3. In the embodiment shown in FIG. 8, only the portion of the circuit that effects the D/A conversion is shown, and the other circuit arrangements are omitted. As shown, the charging MOSFET Q85 has its source connected to a junction 32, its gate connected to a terminal 82, and its drain connected to a power source terminal 88 for supplying a voltage $V_D$. A clock pulse $\phi_{s3}$, as shown in FIG. 9, is supplied to the gate of the MOSFET Q85 via the terminal 82 for precharging the capacitor Cs3. The clock pulse $\phi_s$ to be supplied to the terminal 35 represents a delivery timing of the analog signal, and the signal $\overline{\phi}_s$ to be supplied to the terminal 36 corresponds to a digital signal value to be supplied from the A/D conversion circuit via a counter.

When the clock pulses $\phi_1$, $\phi_{s2}$ are brought to a low level in synchronism with each other, and the pulse $\overline{\phi}_s$ is then brought to ground potential in synchronism therewith, junctions 32 and 34 are charged to $V_D-V_P$. When the clock pulses $\phi_1$, $\phi_{s3}$ are brought to a ground potential and the signal $\overline{\phi}_s$ is brought to a low level $V_D-V_P$, the potential at the junction 32 is lowered to $2(V_d-V_P)$. After one cycle, during which transistors Q4 and Q5 are rendered conductive once alternately is repeated the number of times of the input pulse number, when the pulse $\overline{\phi}_s$ is brought back to the ground potential and the pulse $\phi_s$ is brought to a low level, the potential at the junction 32 appears at the output terminal 31 as an output.

Although, as stated previously, the circuits described in the various embodiments have employed P-channel enhancement type MOS transistor, N-channel enhancement type transistor may also be employed by back-biasing same.

According to the present invention, the circuit elements in portion of the circuit adapted to effect A/D conversion are also used for D/A conversion. As a result, when a digital filter or analog memory is formed, there is no need to take the accuracy of the parts into consideration, thus eliminating a variation in products. In addition, if two or more signal conversion circuits according to the present invention are provided and the phases of the timing pulses other than the clock pulses $\phi_1$, $\phi_2$ are shifted between the respective signal conversion circuits for parallel operation, the apparent signal conversion speed may be increased. In addition, a circuit is provided, which is adapted to detect a variation in temperature by using a variable capacitor, whose capacitance varies depending on temperature, pressure, voltage and the like.

As one modification of the first embodiment shown in FIG. 3, there may be provided a variable counter, in which the input terminal 31 would be connected to an electric power source terminal, and the wave form of a signal from the output terminal 33 would be shaped to feed back same to the terminal 35, so that a bias voltage for the source of the transistor $Q_{35}$ or a ratio of a capacitor $Cs_3$ to $Cr_3$ would be varied.

As is apparent from the foregoing, according to the present invention, an A/D conversion circuit is provided for converting the level of an input analog signal into a pulse number corresponding to the aforesaid level, as well as a D/A convertor for converting a digital signal having a time width corresponding to the pulse number thus converted into an analog signal corresponding to the time width thereof.

What is claimed is:

1. A signal converting circuit for converting an analog to a digital signal, said circuit comprising,
   a sampling capacitor having first and second terminals for holding a charge to be discharged,
   a reference capacitor having first and second terminals for receiving charges from said sampling capacitor, said first terminal of said reference capacitor being grounded;
   a first node;
   first switching means connected to said first terminal of said sampling capacitor for controlling the conductivity between said first terminal of said sampling capacitor and said first node;
   means for rendering said first switching means conductive for charging said first terminal of said sampling capacitor to a given potential;
   means connected to said second terminal of said sampling capacitor for impressing a predetermined reference potential and a ground potential to said second terminal;
   means including second switching means operatively connected to said first terminal of said sampling capacitor and to said second terminal of said reference capacitor for taking out charges from said first terminal of said sampling capacitor and for charging said second terminal of said reference capacitor to said reference potential;
   third switching means operatively connected to said second terminal of said reference capacitor for discharging said reference capacitor to a given potential; and
   means operatively connected to said first terminal of said sampling capacitor and to a second node for detecting when the absolute value of the potential at said first terminal of said sampling capacitor is less than the absolute value of said reference potential and for developing a signal at said second node that bears a relation to the inter-terminal voltage across said sampling capacitor wherein an input analog signal is applied to said first node and an output signal corresponding to said input analog signal is derived at said second node.

2. An analog-to-digital converter comprising,
   an input node receiving an analog input signal;
   a first switching means having one end connected to said input node and the other end for introducing said analog input signal to said other end of said first switching means in response to a sampling signal,
   a sampling capacitor having a first terminal connected to said other end of said first switching means and a second terminal for holding charges corresponding to said introduced analog input signal,
   means connected to said second terminal of said sampling capacitor for impressing a reference potential at the time of said sampling signal and a predetermined potential at the time after said sampling signal disappears,
   A reference capacitor having first and second terminals for holding a predetermined value of charges, said first terminal of said reference capacitor being held at said reference potential,
   a second switching means connected between said first terminal of said sampling capacitor and said second terminal of said reference capacitor for taking out charges to charge said reference capacitor from said sampling capacitor in response to first clock pulses,
   a discharging means for discharging said reference capacitor to said reference potential in response to second clock pulses, said second clock pulses appearing at every interval of said first clock pulses,
   comparing means for comparing a potential at said first terminal of said sampling capacitor and a predetermined threshold potential to derive a digital output signal in response to said first clock pulses until the potential at said first terminal of said sampling capacitor reaches said predetermined threshold potential, and an output node for deriving said digital output signal.

3. The circuit of claim 1 or 2 in which the value of capacitance of said reference capacitor is less than that of said sampling capacitor.

4. The analog-to-digital converter claimed in claim 2, wherein said comparing means includes a field effect transistor having a source coupled to said first terminal of said sampling capacitor, a drain coupled to said output node and a gate receiving said first clock pulses, and a capacitive component connected between said gate and said drain of said field effect transistor.

5. The analog-to-digital converter claimed in claim 4, wherein the capacitance of said capacitive component is less than that of the capacitance of said reference capacitor.

6. A signal converting circuit for converting an analog to a digital signal and vice versa, by transferring charges, said circuit comprising, an input node receiving an input signal, a first switching means having one end connected to said input node and the other end for introducing said input signal to said other end of said first switching means in response to a start pulse, a sampling capacitor having a first terminal connected to said other end of said first switching means and a second terminal for holding charges corresponding to said introduced input signal, means connected to said second terminal of said sampling capacitor for impressing one or two predetermined potentials, a reference capacitor having first and second terminals for holding a predetermined value of charges, said first terminal of said reference capacitor held at a reference potential, a second switching means connected between said first terminal of said sampling capacitor and said second terminal of said reference capacitor for taking out charge to charge said reference capacitor from said sampling capacitor in response the first clock pulses, discharging means for discharging said reference capacitor to said reference potential in response to the second clock pulses, said second clock pulses appearing at each interval of said first clock pulses, comparing means for comparing a potential at said first terminal of said sampling capacitor and a predetermined threshold potential to derive a digital output signal in response to said first clock pulses until the potential at said first terminal of said sampling capacitor reaches said predetermined threshold potential, a first output node coupled to said comparing means for deriving said digital output signal, detecting means for detecting an analog signal at said first terminal of said sampling capacitor after the charge in said sampling capacitor is removed to said reference capacitor in a number of intervals corresponding to a digital signal to be converted to an analog signal; and a second output node coupled to said detecting means for deriving an analog output signal corresponding to said analog signal at said first terminal of said sampling capacitor, whereby analog-to-digital conversion is accomplished by applying an analog input signal to said input node when said second terminal of said sampling capacitor is at said reference potential and deriving said digital output signal from said first output node when said second terminal of said sampling capacitor is at the potential of said second clock pulses, and digital-to-analog conversion is done by applying a predetermined potential to said input node, holding said second terminal of said sampling capacitor at said reference potential and deriving said analog output signal from said second output node.

7. A digital-to-analog converter comprising, a node held at a first predetermined potential;

a first switching means having one end connected to said node and the other end for introducing said predetermined potential to said other end of said first switching means in response to a reset signal, a first capacitor having a first terminal connected to said first switching means and a second terminal held at a reference potential for holding charges corresponding to said first predetermined potential in response to said reset signals, a second capacitor having first and second terminals for holding a predetermined value of charges, said first terminal of said second capacitor being held at said reference potential, a second switching means connected between said first terminal of said first capacitor and said second terminal of said second capacitor for transferring charges from said first capacitor to said second capacitor in response to first clock pulses, discharging means for discharging said second capacitor to said reference potential in response to second clock pulses, said second clock pulses appearing during each intervals of said first clock pulses, and output means for deriving an analog output signal at said first terminal of said first capacitor after the charge in said first capacitor is removed to said second capacitor in a number of intervals corresponding to a digital signal to be converted to an analog signal.

8. The digital-to-analog converter claimed in claim 7, further comprising an inverter coupled to said output means for inverting said analog output signal.

9. The digital-to-analog converter claimed in claim 7, wherein the capacitance of said first capacitor is larger than that of the capacitance of said second capacitor.

* * * * *